United States Patent
Kobayashi et al.

(10) Patent No.: US 6,538,521 B2
(45) Date of Patent: Mar. 25, 2003

(54) VOLTAGE CONTROLLED OSCILLATOR

(75) Inventors: Hiroki Kobayashi, Fukushima-ken (JP); Yasuhiro Ikarashi, Fukushima-ken (JP); Yutaka Chiba, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 09/879,632

(22) Filed: Jun. 12, 2001

(65) Prior Publication Data

US 2002/0005764 A1 Jan. 17, 2002

(30) Foreign Application Priority Data

Jun. 13, 2000 (JP) .......................................... 2000-177289

(51) Int. Cl.$^7$ ................................................ H03L 7/00
(52) U.S. Cl. ......................... 331/34; 331/167; 331/179
(58) Field of Search ............................. 331/34, 177 V, 331/117 R, 167, 179

(56) References Cited

U.S. PATENT DOCUMENTS 5,973,519 A * 10/1999 Yamashita ................... 327/101
6,194,976 B1 * 2/2001 Cantey et al. ............... 331/167

FOREIGN PATENT DOCUMENTS

JP        7-22840        1/1995

* cited by examiner

Primary Examiner—Robert Pascal
Assistant Examiner—Kimberly E Glenn
(74) Attorney, Agent, or Firm—Brinks Hofer Gilson & Lione

(57) ABSTRACT

In a voltage controlled oscillator for switching oscillation frequency bands by supplying a band switching signal to an LC resonator circuit that is connected in a phase locked loop having a phase comparator and a loop filter and sets oscillation frequencies, the LC resonator circuit includes at least two inductor elements the connection and non-connection of a part of which are switched in response to a band switching signal and a capacitor element in which a voltage variable capacitor element whose capacitance value is adjusted in response to the control voltage from the loop filter is connected in series to impedance elements acting as a composite element that exhibits a capacitance value in oscillation frequency ranges. With this arrangement, when an oscillation signal is selectively output in a high or low frequency band by switching the LC resonator circuit, the voltage controlled oscillator can increase the difference between the rates of change Kv in the high and low frequency bands.

2 Claims, 3 Drawing Sheets

VOLTAGE CONTROLLED OSCILLATOR

BACKGROUND OF THE INVENTION

1. Field of the Invention

The present invention relates to a voltage controlled oscillator (VCO), and more particularly, to a voltage controlled oscillator (VCO) connected and disposed in a phase locked loop (PLL) and capable of switching oscillation frequency bands by supplying a band switching signal to an LC resonator circuit.

2. Description of the Related Art

Hitherto, there are known, as the mobile telecommunication systems used in respective countries in the world, DCS (Digital Cellular system ) used in England, Germany, Italy, France, and some countries of Asia and GSM (Global System for Mobile Communications) used in Europe, the United States, Africa, and some countries in Asia as European Standard System for digital hand-held phones. Since DCS and GSM are mobile telecommunication systems employing a different telecommunication system, users must be provided with two hand-held phones, that is, a hand-held phone used for DCS (hand-held phone dedicated for DCS) and a hand-held phone used for GSM (hand-held phone dedicated for GSM) in order to subscribe to both of DCS and GSM.

However, since both of DCS and GSM use GMSK (Gaussin Minimum Shift keying) as a signal modulation system while they employ a different communication system, they are different from each other only in that their usable frequency band is different. Accordingly, hand-held phones which can be commonly used by both of DCS and GSM are being developed in place of using two hand-held phones dedicated for DCS and GSM and several commonly usable hand-held phones have been proposed.

These previously proposed hand-held phones which are commonly usable in DCS and GSM include two voltage controlled oscillators, that is, a first voltage controlled oscillator for generating a local oscillation signal suitable for a DCS band receiving frequency and a second voltage controlled oscillator for generating a local oscillation signal suitable for a GSM band receiving frequency, and they selectively use the first and second voltage controlled oscillators based on whether they are used in DCS or in GSM. These previous commonly usable hand-held phones use the two voltage controlled oscillators as well as connect them to individual phase locked loops, which inevitably increases the size of the commonly usable hand-held phones as well as increases the number of parts thereof, which makes the cost of the previous commonly usable hand-held phones expensive.

Hand-held phones commonly usable in the DCS and the GSM, which were proposed after the development of the previous hand-held phones to improve the disadvantages of them (improved-type hand-held phones), employ one voltage controlled oscillator connected to one phase locked loop and are switched to DCS and GSM by switching the resonance circuit of the voltage controlled oscillator in response to a band switching signal. That is, the switching of the resonance circuit in response to the band switching signal permits the voltage controlled oscillator to output a local oscillation signal having an oscillation frequency suitable for the receiving frequency of the DCS band and a local oscillation signal having an oscillation frequency suitable for the receiving frequency-of the GSM band, respectively.

FIG. 4 is a block diagram showing an example of the arrangement of a phase locked loop to which one voltage controlled oscillator used in an improved-type hand-held phone is connected, and FIG. 5 is a circuit diagram showing an example of the arrangement of the main portion of the voltage controlled oscillator connected to the phase locked loop shown in FIG. 4.

As shown in FIG. 4, the phase locked loop (PLL) includes a voltage controlled oscillator (VCO) 31, a loop filter (LPF) 32, a phase comparison circuit (COMP) 33, a reference frequency signal input terminal 34, and an oscillation signal output terminal 35.

The output terminal (oscillation signal output terminal) of the voltage controlled oscillator 31 is connected to the oscillation signal output terminal 35 and to one input terminal of the phase comparison circuit 33, and the input terminal (control voltage input terminal) thereof is connected to the output terminal of the loop filter 32. The output terminal of the phase comparison circuit 33 is connected to the input terminal of the loop filter 32, and the other input terminal thereof is connected to the reference frequency signal input terminal 34.

As is known well, the operation of the phase locked loop is such that the phase comparison circuit 33 compares the phase of the oscillation signal of the voltage controlled oscillator with the phase of a reference frequency signal, outputs an error signal indicating the error between the phases of the oscillation signal and the reference frequency signal, and supplies the error signal to the loop filter 32. The loop filter 32 smooths the inputted error signal, outputs it as a control voltage and supplies the control voltage to the LC resonator circuit of the voltage controlled oscillator. In the voltage controlled oscillator 31, the resonance frequency of the LC resonator circuit is controlled in correspondence to the control voltage supplied thereto, whereby the frequency of an oscillation signal is adjusted to a normal frequency.

As shown in FIG. 5, the voltage controlled oscillator (VCO) 31 includes the LC resonator circuit 41, an amplifier stage 42, a control voltage input terminal 43, an oscillation signal output terminal 44, a band switching signal input terminal 45, a shunt capacitor 46, a series inductor 47, a coupling capacitor 48, and a series resistor 49. In this case, the LC resonator circuit 41 includes a varactor diode $41_1$, a first inductor $41_2$, a second inductor $41_3$, a first direct current preventing capacitor $41_4$, a second direct current preventing capacitor $41_5$, and a switching diode $41_6$. Note that, the same reference numerals as used in FIG. 4 are used in FIG. 5 to denote the same components.

In the LC resonator circuit 41, the anode of the varactor diode $41_1$ is connected to the ground, the cathode thereof is connected to one end of the first direct current preventing capacitor $41_4$ and to the other end of the series inductor 47. One end of the first inductor $41_2$ is connected to the other end of the first direct current preventing capacitor $41_4$ and to one end of the coupling capacitor 48, and the other end thereof is connected to one end of the second inductor $41_3$ and to one end of the second direct current preventing capacitor $41_5$. The other end of the second inductor $41_3$ is connected to the ground. The other end of the second direct current preventing capacitor $41_5$ is connected to the anode of the switching diode $41_6$ and to one end of the series resistor 49. The cathode of the switching diode $41_6$ is connected to the ground. Further, the input terminal of the amplifier stage 42 is connected to the other end of the coupling capacitor 48, and the output terminal thereof is connected to the oscillation signal output terminal 44. In addition to the above, one end of the shunt capacitor 46 is connected to the control voltage input terminal 43 and to one end of the series inductor 47. The other end of the shunt capacitor 46 is connected to the ground. The other end of the series resistor 49 is connected to the band switch signal input terminal 45.

The voltage controlled oscillator 31 arranged as described above will operate as follows. When the voltage controlled oscillator 31 is used as the local oscillator for DCS, a band switching signal of a positive voltage is supplied to the band switching signal input terminal 45. The band switching signal of the positive voltage is applied to the anode of the switching diode $41_6$ through the series resistor 49 to thereby turn on the switching diode $41_6$ so as to electrically short circuit the second inductor $41_3$. Further, the control voltage supplied to the control voltage input terminal 43 is supplied to the varactor diode $41_1$ through the series inductor 47 so that the capacitance value of the varactor diode $41_1$ is varied in correspondence to the magnitude of the control voltage. At this time, the LC resonator circuit 41 is parallel-resonated with the inductance value of the first inductor $41_2$ and the series capacitance value of the varactor diode $41_1$, which is connected in parallel to the first inductor $41_2$, and the first direct current preventing capacitor $41_4$, and an oscillation signal (in a high frequency band, for example, from 1450 MHz to 1500 MHz), which corresponds to the parallel resonance frequency, is generated to the amplifier stage 42 and supplied to the oscillation signal output terminal 44 from the output terminal thereof.

Next, when the voltage controlled oscillator 31 is used as the local oscillator for GSM, a band switching signal of a ground voltage is supplied to the band switching signal input terminal 45. Since the band switching signal of the ground voltage only makes the anode voltage of the switching diode $41_6$ as large as the cathode voltage thereof, the switching diode $41_6$ is turned off so that the second inductor $41_3$ is connected in series to the first inductor $41_2$. Further, the control voltage supplied to the control voltage input terminal 43 is supplied to the varactor diode $41_1$ through the series inductor 47 similarly to the above mentioned case and varies the capacitance value of the varactor diode $41_1$ in correspondence to the magnitude of the control voltage. At this time, the LC resonator circuit 41 is parallel-resonated with the overall inductance value of the first inductor $41_2$ and the second inductor $41_3$, which are connected in series to each other, and the series capacitance value of the varactor diode $41_1$, which is connected to the series circuit of the first and second inductors $41_2$ and $41_3$, and the first direct current preventing capacitor $41_4$, and an oscillation signal (in a low frequency band, for example, from 1250 MHz to 1300 MHz), which corresponds to the parallel resonance frequency, is generated to the amplifier stage 42 and supplied to the oscillation signal output terminal 44 from the output terminal thereof.

The voltage controlled oscillator used in the improved-type hand-held phone, which can selectively output local oscillation signals in the two frequency bands, that is, in the high frequency band and in the low frequency band, by using the one voltage-controlled oscillator 31 and switching the LC resonator circuit 41 of the voltage controlled oscillator 31, employs the one voltage controlled oscillator 31 and the one loop filter 32, thereby employing the one phase locked loop. As a result, the voltage controlled oscillator can avoid an increase in size of the commonly usable hand-held phone as well as can prevent an increase in the manufacturing cost thereof.

However, the voltage controlled oscillator used in the improved-type hand-held phone employs the one loop filter 32 with respect to the two oscillation frequency bands of the high and low frequency bands as well as selectively outputs local oscillation signals of the two oscillation frequency bands by switching the LC resonator circuit 41. Thus, when the rate of change of an oscillation frequency Kv per unit control voltage (which is hereinafter referred to as a rate of change Kv) in the range in which the control voltage is used is determined as to the two oscillation frequency bands, the rate of change Kv in the low frequency band is in the same level as that in the high frequency band. As a result, it is difficult to make a difference between the rate of change Kv in the high frequency band and the rate of change Kv in the low frequency band, which exhibits undesirable characteristics when two discrete oscillation frequencies are controlled in the phase locked loop (PLL).

These undesirable characteristics can be avoided by dividing the loop filter 32 for supplying the control voltage to the voltage controlled oscillator 31 into two loop filters, that is, into a first loop filter for supplying a control voltage for the high frequency band and a second loop filter for supplying a control voltage for the low frequency band and by setting the filter characteristics of the first and second loop filters so as to increase a difference between the corresponding rates of change Kv. However, the provision of the two loop filters makes it difficult to avoid the increase in size and manufacturing cost of the commonly usable hand-held phone.

SUMMARY OF THE INVENTION

Accordingly, it is an object of the present invention, which was made in view of the above technical background, to provide a voltage controlled oscillator capable of increasing a difference between rates of change Kv in high and low frequency bands when an oscillation signal of the high or low frequency band is selectively outputted by switching an LC resonator circuit even if one loop filter is used.

To achieve the above object, in a voltage controlled oscillator according to the present invention including an LC resonator circuit that is connected in a phase locked loop having a phase comparator and a loop filter and sets oscillation frequencies as well as switching oscillation frequency bands by supplying a band switching signal to the LC resonator circuit, the LC resonator circuit includes a means having at least two inductor elements or capacitor elements and a capacitor element in which a voltage variable capacitor element is connected in series to a composite impedance element, a part of the at least two inductor elements or capacitor elements being switched to connection and non-connection in response to the band switching signal, the capacitance value of the voltage variable capacitor element being adjusted by the control voltage from the loop filter, and the composite impedance element exhibiting a capacitance value in oscillation frequency ranges.

According to the above-mentioned means, since the capacitor element, in which the voltage variable capacitor element is connected in series to the composite impedance element that exhibits the capacitance value in the oscillation frequency ranges, is used as the capacitor element of the LC resonator for setting oscillation frequencies, a rate of change Kv in a high oscillation frequency band is made small as a whole as well as a rate of change Kv in a low oscillation frequency band is made small as a whole. As a result, it is possible to provide a large difference between a changing state of the rate of change Kv in the high oscillation frequency band and a changing state of the rate of change Kv in the low oscillation frequency band, whereby the oscillation frequencies of the two discrete oscillation frequency bands can be excellently controlled by the control voltage even if the only one loop filter is used.

In this case, it is preferable that the composite impedance element used in the voltage controlled oscillator of the present invention be a series circuit of a direct current preventing capacitor and an inductor element having a fine inductance value.

With this arrangement, the composite impedance element for increasing the difference between the rates of change Kv in the high and low frequency bands can be realized by a very simple arrangement.

DESCRIPTION OF THE PREFERRED EMBODIMENTS

An embodiment of the present invention will be described below with reference to the drawings.

Figure 1:
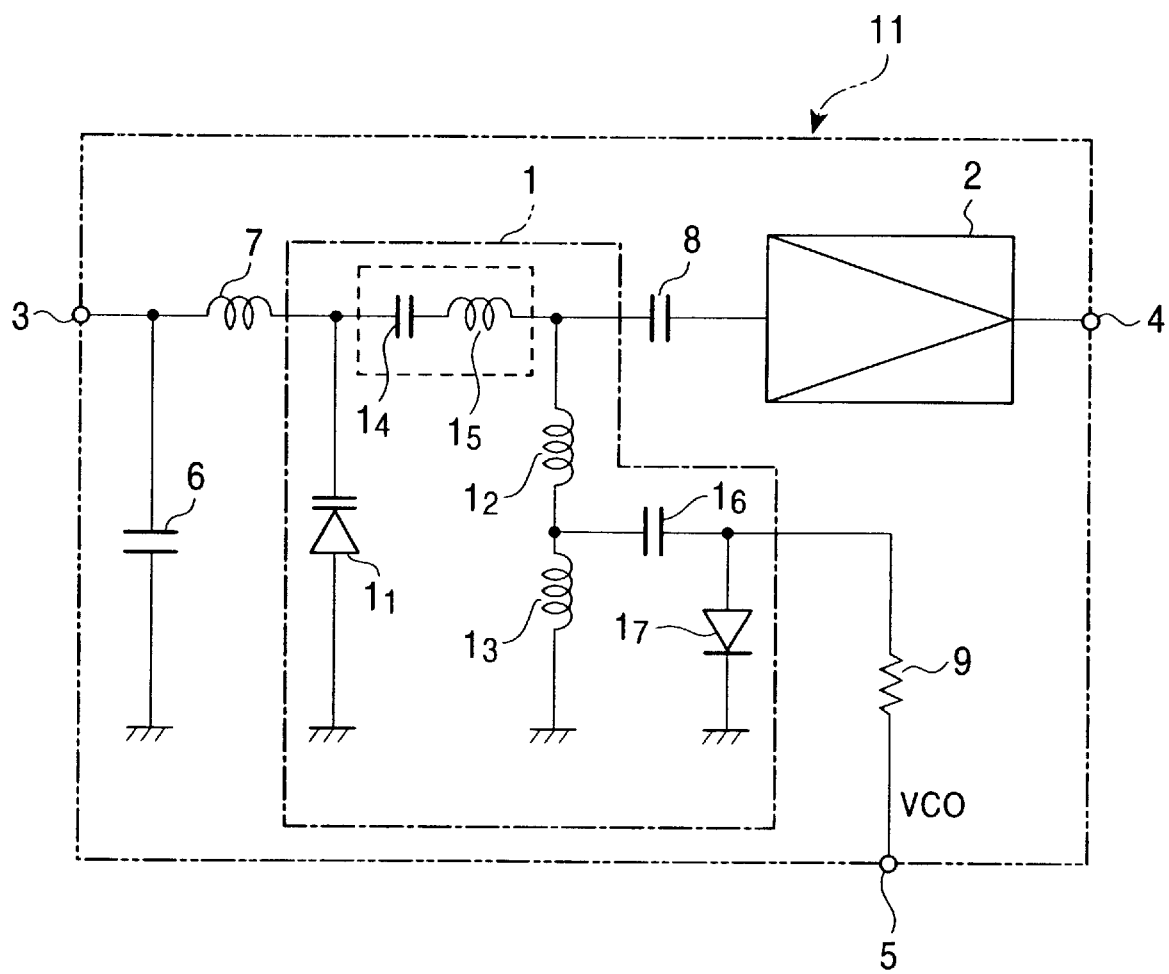
FIG. 1 is a circuit diagram showing the arrangement of the main portion of a voltage controlled oscillator of an embodiment of the present invention.

FIG. 1 is a circuit diagram showing the arrangement of the main portion of a voltage controlled oscillator of an embodiment of the present invention.

As shown in FIG. 1, a voltage controlled oscillator (VCO) 11 according to this embodiment includes an LC resonator circuit 1 for setting an oscillation frequency, an amplifier stage 2, a control voltage input terminal 3, an oscillation signal output terminal 4, a band switching signal input terminal 5, a shunt capacitor 6, a series inductor 7, a coupling capacitor 8, and a series resistor 9. In this case, the LC resonator circuit 1 includes a varactor diode $1_1$, a first inductor $1_2$, a second inductor $1_3$, a first direct current preventing capacitor $1_4$, an additional inductor $1_5$ having a minute inductance value, a second direct current preventing capacitor $1_6$, and a switching diode $1_7$.

In the LC resonator circuit 1, the anode of the varactor diode $1_1$ is grounded and the cathode thereof is connected to one end of the first direct current preventing capacitor $1_4$ and to the other end of the series inductor 7. One end of the first inductor $1_2$ is connected to the other end of the additional inductor $1_5$ and to one end of the coupling capacitor 8 and the other end thereof is connected to one end of the second inductor $1_3$ and to one end of the second direct current preventing capacitor $1_6$. The other end of the second inductor $1_3$ is connected to the ground, and the other end of the first direct current preventing capacitor $1_4$ is connected to one end of the additional inductor $1_5$. The other end of the second direct current preventing capacitor $1_6$ is connected to the anode of the switching diode $1_7$ and to one end of the series resistor 9. The cathode of the switching diode $1_7$ is connected to the ground.

Figure 4:
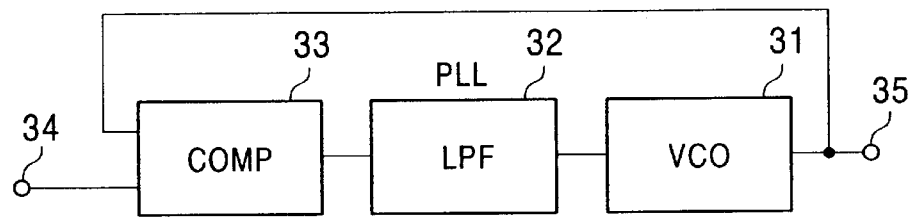
FIG. 4 is a block-diagram showing an example of the arrangement of a phase locked loop to which one voltage controlled oscillator used in an improved-type hand-held phone is connected.

Further, the input end of the amplifier stage 2 is connected to the other end of the coupling capacitor 8 and the output terminal thereof is connected to the oscillation signal output terminal 4. The control voltage input terminal 3 is connected to one end of the shunt capacitor 6 and to one end of the series inductor 7, respectively in the interior of the voltage controlled oscillator 11, and connected to the output terminal of a loop filter (not shown) in the exterior of the voltage controlled oscillator 11. The oscillation signal output terminal 4 is connected to the first input end of a phase comparator (not shown) in the exterior of the voltage controlled oscillator 11. With this arrangement, the voltage controlled oscillator 11 constitutes one phase locked loop (PLL) as shown in FIG. 4 together with the loop filter and the phase comparator. The other end of the shunt capacitor 6 is connected to the ground. The other end of the series resistor 9 is connected to the band switching signal input terminal 5.

A series connection circuit, which is composed of the first direct current preventing capacitor $1_4$ and the additional inductor $1_5$, constitutes a composite impedance element. The minute inductance value of the additional inductor $1_5$ is set such that the reactance value of the composite impedance element exhibits a certain capacitance value when a control voltage to be supplied to the voltage controlled oscillator 11 is within the range of, for example, 1.2 V to 1.8 V in which the control voltage is used. For example, when the voltage controlled oscillator 11 is used as local oscillation circuits for DCS and GSM, the minute inductance value of the additional inductor $1_5$ is set to 1 nH when the first direct current preventing capacitor $1_4$ has a capacitance of 4.3 pF.

Figure 5:
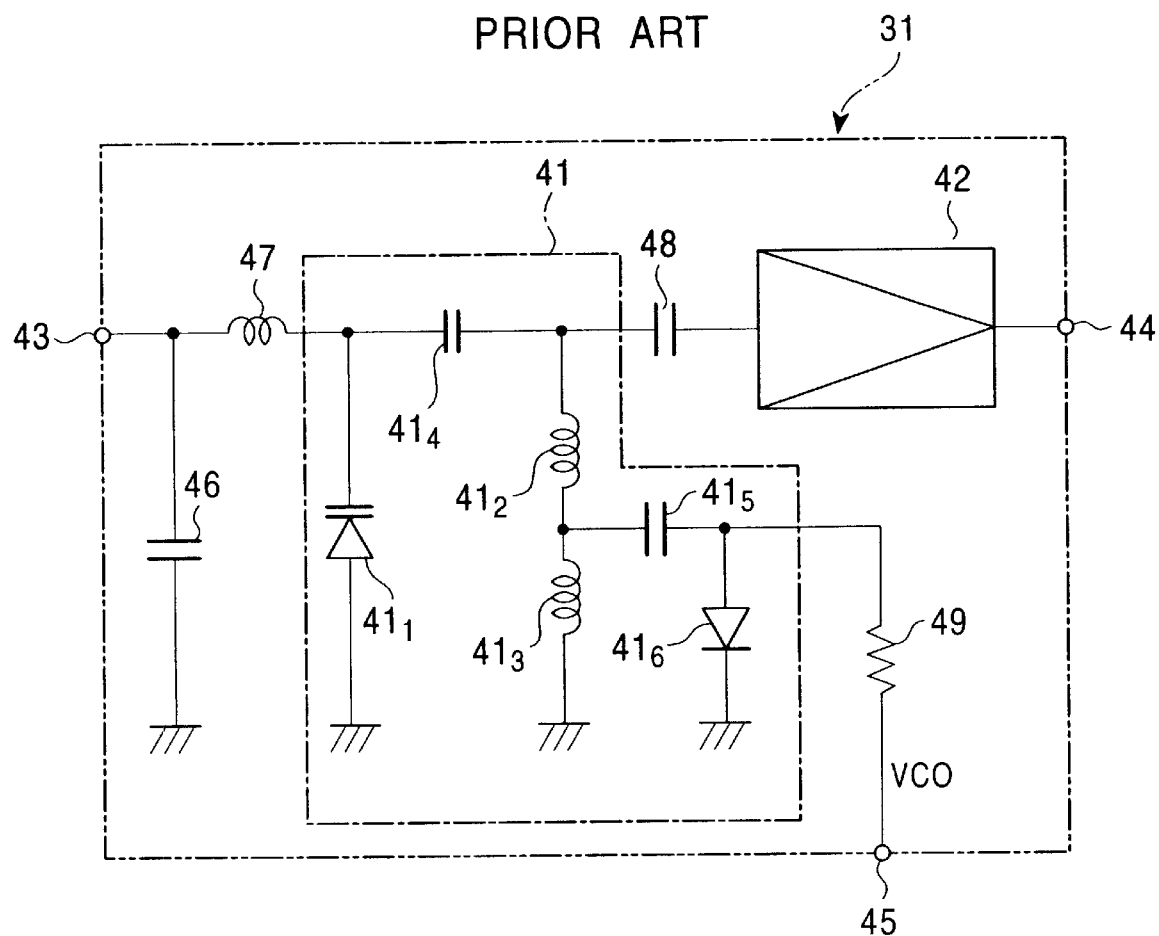
FIG. 5 is a circuit diagram showing an example of the arrangement of the main portion of the voltage controlled oscillator connected to the phase locked loop shown in FIG. 4.

Note that the voltage controlled oscillator 11 of the embodiment is arranged similarly to the known voltage controlled oscillator 31 shown in FIG. 5 except that the additional inductor $1_5$ is connected in series to the first direct current preventing capacitor $1_4$.

The voltage controlled oscillator 11 of this embodiment arranged as described above will operate as follows.

When the voltage controlled oscillator 11 is oscillated in the high frequency band, for example, when it is used as a local oscillator for DCS, a band switching signal of a positive voltage is supplied to the band switching signal input terminal 5. The thus supplied band switching signal of the positive voltage is applied to the anode of the switching diode $1_7$ through the series resistor 9, thereby turning on the switching diode $1_7$ so as to electrically short circuit the second inductor $1_3$. Further, a control voltage supplied from the loop filter to the control voltage input terminal 3 is supplied to the varactor diode $1_1$ through the series inductor 7 and varies the capacitance value of the varactor diode $1_1$ in correspondence to the magnitude of the control voltage. At this time, the LC resonator circuit 1 is parallel-resonated with the inductance value of the first inductor $1_2$ and the parallel capacitance value of the capacitance value of the varactor diode $1_1$ and the capacitance value exhibited by the composite impedance element (series-connected circuit of the first direct current preventing capacitor $1_4$ and the additional inductor $1_5$), and an oscillation signal of a high frequency band (for example, from 1450 MHz to 1500 MHz) is generated to the amplifier stage 2 in correspondence to the parallel resonance frequency, supplied to the oscillation signal output terminal 4 from the output terminal thereof and derived from the voltage controlled oscillator 11.

In contrast, when the voltage controlled oscillator 11 is oscillated in the low frequency band, for example, when it is used as a local oscillator for GSM, a band switching signal of a ground voltage is supplied to the band switching signal input terminal 5. Application of the band switching signal of the ground voltage to the anode of the switching diode $1_7$ only makes the anode voltage thereof as large as its cathode voltage, which turns off the switching diode $1_7$ so as to connect the second inductor $1_3$ in series to the first inductor $1_2$. Further, similarly to the above mentioned case, a control voltage supplied from the loop filter to the control voltage input terminal 3 is supplied to the varactor diode $1_1$ through the series inductor 7 and varies the capacitance value of the varactor diode $1_1$ in correspondence to the magnitude of the control voltage. At this time, the LC resonator circuit 1 is parallel-resonated with the series inductance value of the first inductor $1_2$ and the second inductor $1_3$, which are connected in series to each other, and the parallel capacitance value of the capacitance value of the varactor diode $1_1$ and the capacitance value exhibited by the composite impedance element (series connected-circuit of the first direct current preventing capacitor $1_4$ and the additional inductor $1_5$), and an oscillation signal of a low frequency band (for example, from 1250 MHz to 1300 MHz) is generated to the amplifier stage 2 in correspondence to the parallel resonance frequency, supplied to the oscillation signal output terminal 4 from the output terminal thereof and derived from the voltage controlled oscillator 11.

Figure 2:
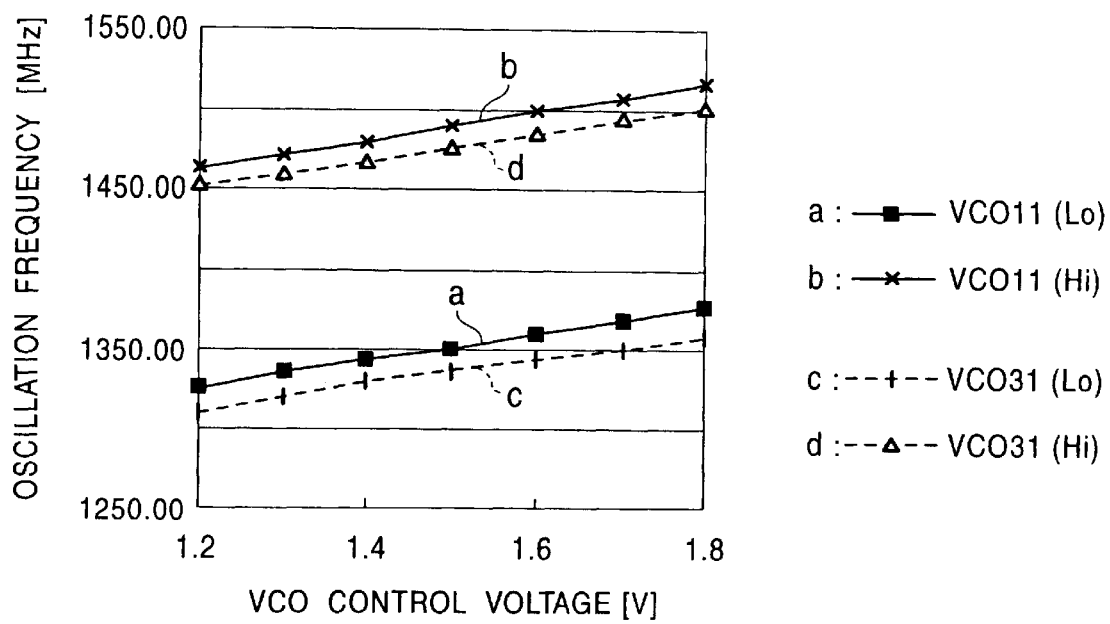
FIG. 2 is a characteristic view showing an example of a changing state of oscillation frequencies in low and high oscillation frequency bands when a control voltage is changed in the voltage controlled oscillator shown in FIG. 1.

Next, FIG. 2 is a characteristic view showing an example of a changing state of oscillation frequencies in the low oscillation frequency band (GSM) and in the high oscillation frequency band (DCS) when the control voltage (VCO control voltage) is changed in the voltage controlled oscillator (VCO) 11 shown in FIG. 1 in comparison with a changing state of oscillation frequencies of the known voltage controlled oscillator (VCO) 31 shown in FIG. 5.

In this case, the VCO 11 and the VCO 31, which are compared with each other in the characteristic view shown in FIG. 2, have the same arrangement except that the VCO 11 includes the additional inductor $1_5$ which has the minute inductance value 1 nH and connected to the VCO 031.

Further, in FIG. 2, a curve a is a characteristic curve showing an example of a changing state of an oscillation frequency in the low oscillation frequency band (GSM) of the VCO 11, a curve b is a characteristic curve showing an example of a changing state of an oscillation frequency in the high oscillation frequency band (DCS) of the VCO 11, a curve c is a characteristic curve showing an example of a changing state of an oscillation frequency in the low oscillation frequency band (GSM) of the VCO 31, and a curve d is a characteristic curve showing an example of a changing state of an oscillation frequency in the high oscillation frequency band (DCS) of the VCO 31.

As shown in FIG. 2, the VCO 11 of this embodiment can control oscillation frequencies approximately similarly to the known VCO 31 in correspondence to the control voltage supplied thereto even if the additional inductor $1_5$ is connected to the LC resonator circuit 1.

Figure 3:
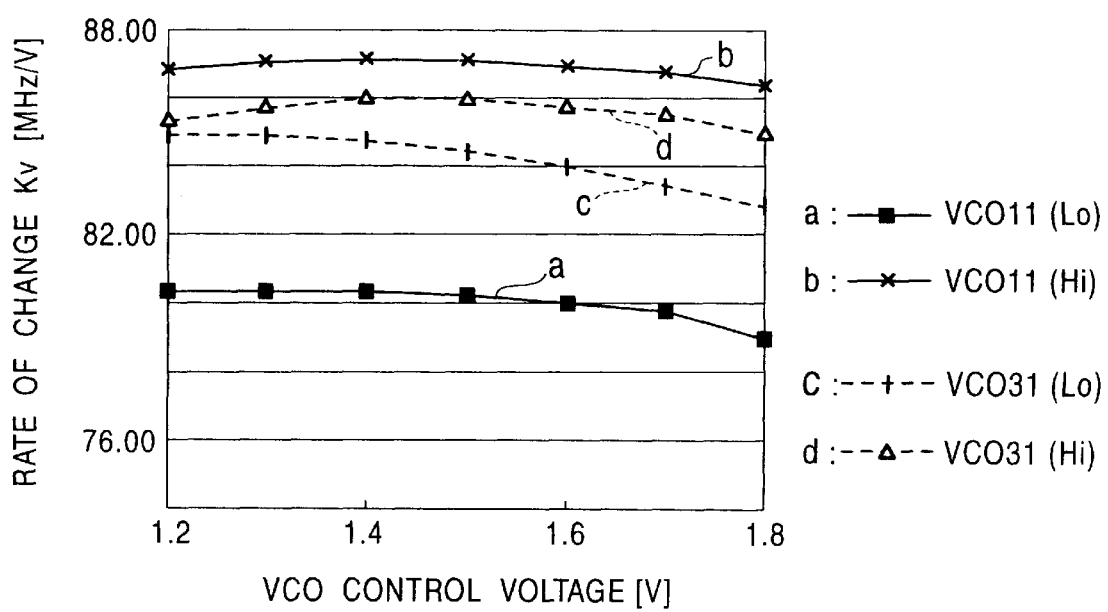
FIG. 3 is a characteristic view showing an example of a changing state of rates of change Kv in low and high oscillation frequency bands when a control voltage is changed in the voltage controlled oscillator shown in FIG. 1.

Subsequently, FIG. 3 is a characteristic view showing an example of a changing state of the rates of change Kv in the low oscillation frequency band (GSM) and in the high oscillation frequency band (DCS) when the control voltage (VCO control voltage) is changed in the VCO 11 shown in FIG. 1 in comparison with a changing state of the rate of change Kv of the known voltage controlled oscillator (VCO) 31 shown in FIG. 5.

In this case, the VCO 11 and VCO 31 which are compared with each other in the characteristic view shown in FIG. 3 is the same as the VCO 11 and VCO 31 which are compared with each other in FIG. 2.

Further, in FIG. 3, a curve a is a characteristic curve showing an example of a changing state of the rate of change Kv in the low oscillation frequency band (GSM) of the VCO 11, a curve b is a characteristic curve showing an example of a changing state of the rate of change Kv in the high oscillation frequency band (DCS) of the VCO 11, a curve c is a characteristic curve showing an example of a changing state of the rate of change Kv in the low oscillation frequency band (GSM) of the VCO 31, and a curve d is a characteristic curve showing an example of a changing state of the rate of change Kv in the high oscillation frequency band (DCS) of the VCO 31.

Further, as shown in FIG. 3, when the control voltage is changed only in the range from 1.2 V to 1.8 V in which the control voltage is used, there is a relatively small difference as a whole between the rate of change Kv in the low oscillation frequency band (GSM) in the known VCO 31 (characteristic curve c) and the rate of change Kv in the high oscillation frequency band (DCS) in the known VCO 31 (characteristic curve d). Moreover, the difference therebetween tends to successively increase as the control voltage increases from 1.2 V to 1.8 V. In contrast, the rate of change Kv in the low oscillation frequency band (GSM) in the VCO 11 (characteristic curve a) is considerably small as a whole as compared with the rate of change Kv in the low oscillation frequency band (GSM) in the known VCO 031, whereas the rate of change Kv in the high oscillation frequency band (DCS) in the VCO 11 (characteristic curve b) is somewhat large as a whole as compared with the rate of change Kv in the high oscillation frequency band (DCS) in the known VCO 31 (characteristic curve d). As a result, the difference between the rate of change Kv in the low oscillation frequency band (GSM) in the VCO 11 (characteristic curve a) and the rate of change Kv in the high oscillation frequency band (DCS) in the VCO 11 (characteristic curve b) is considerably increased as a whole as compared with the difference between the rates of change Kv in the VCO 31. Contrary to the above, however, the rate of change Kv in the low oscillation frequency band (GSM) and the rate of change Kv in the high oscillation frequency band (DCS) are approximately constant regardless of an increase and decrease of the control voltage in the range of 1.2 V to 1.8 V in which the control voltage is used.

As described above, the connection of the additional inductor $1_5$ to the LC resonator circuit 1 permits the VCO 11 of this embodiment to arbitrarily increase the difference between the rates of change Kv in the low oscillation frequency band (GSM) and the high oscillation frequency band (DCS) with respect to the control voltage supplied to the VCO 11 within in the range in which it is used even if the one common loop filter is used to the low oscillation frequency band (GSM) and the high oscillation frequency band (DCS). Furthermore, the rates of change Kv in the low oscillation frequency band (GSM) and the high oscillation frequency band (DCS) can be set approximately constant regardless of the control voltage in the range it is used, whereby a voltage controlled oscillator can be obtained which has such a preferable characteristic that it can control the oscillation frequencies in the two oscillation frequency bands in the same manner using the same control voltage.

Further, in this embodiment, since the composite impedance element of the VCO 11 is composed the series-connected circuit of the first direct current preventing capacitor $1_4$ and the additional inductor $1_5$, the arrangement of the composite impedance element can be simplified.

It should be noted that while the above embodiment has been described with reference to the example in which the composite impedance element is composed of the first direct current preventing capacitor $1_4$ having the capacitance value of 4.3 pF and the additional inductor $1_5$ having the fine inductance value of 1 nH, the composite impedance element of the present invention is not limited thereto, and it is needless to say that the first direct current preventing capacitor $1_4$ and the additional inductor $1_5$ may have any other values as long as they can arbitrarily set the difference between the rate of change Kv of the low oscillation frequency band (GSM) and the rate of change Kv of the high oscillation frequency band (DCS) with respect to the control voltage in the range in which it is used.

While the above embodiment has been described with reference to the example in which the composite impedance element is composed of the series-connected circuit including the first direct current preventing capacitor $1_4$ and the additional inductor $1_5$, the composite impedance element of the present invention is not limited to the case in which it is composed of the series-connected circuit and any other circuit arrangements may be employed as long as they prevent passing of a DC voltage (control voltage) as well as includes an inductor and exhibits a capacitance property over the entire oscillation frequency bands.

Further, while the above embodiment has been described as to the example in which the local oscillation circuit for GSM is used in the low oscillation frequency band and the local oscillation circuit for DCS is used in the high oscillation frequency band, the low oscillation frequency band and the high oscillation frequency band which act as the targets of the present invention are not limited to GSM and DCS and other two oscillation frequency bands similar to them may be used as the targets of the present invention.

In addition to the above, while this embodiment has been described with reference to the example in which the oscillation frequency bands are switched by switching the connect and non-connect of the second inductor $1_3$ of the LC resonator circuit 1, the switching of the oscillation frequency bands according to the present invention is not limited thereto, and the oscillation frequency bands may be switched by switching the connect and non-connect of a part of capacitors.

As described above, according to the voltage controlled oscillator of the present invention, since the capacitor element, in which the voltage variable capacitor element and the composite impedance element which exhibits the capacitance value in the range of the oscillation frequencies are connected in series to each other, is used as the capacitor element of the LC resonator circuit for setting the oscillation frequencies, the voltage controlled oscillator can arbitrarily increase the difference between the rates of change Kv in the low and high oscillation frequency bands with respect to the control voltage in the range in which it is used and further keep the rates of change Kv in the low and high oscillation frequency bands approximately constant regardless of the control voltage in the range in which it is used. As a result, an advantage can be obtained in that the oscillation frequencies can be excellently controlled by the control voltage in the respective oscillation frequency bands even if the only one loop filter is used.

What is claimed is:

1. A voltage controlled oscillator comprising an LC resonator circuit that is connected in a phase locked loop having a phase comparator and a loop filter and sets oscillation frequencies as well as switching oscillation frequency bands by supplying a band switching signal to the LC resonator circuit, said LC resonator circuit including:

a first inductor element including at least two inductors, an inductance value of said first inductor element being switched by short-circuiting or non-short-circuiting one of said at least two inductors in response to the band switching signal;

a voltage variable capacitor element, a capacitance value of said voltage variable capacitor element being adjusted by a control voltage from said loop filter; and said composite impedance element exhibiting a capacitance value in oscillation frequency ranges, wherein said voltage variable capacitor element and said composite impedance element are connected in series to each other, and said first inductor element is connected in parallel with a series circuit of said voltage variable capacitor element and said composite impedance element.

2. A voltage controlled oscillator according to claim 1, wherein said composite impedance element is an element that produces an approximately constant difference between rates of change of oscillation frequencies in respective oscillation frequency bands in a range in which the control voltage is used, as well as increases the difference between rates of change of the oscillation frequencies in two oscillation frequency bands.

* * * * *

UNITED STATES PATENT AND TRADEMARK OFFICE
CERTIFICATE OF CORRECTION

PATENT NO.   : 6,538,521 B2
DATED        : March 25, 2003
INVENTOR(S)  : Hiroki Kobayashi et al.

It is certified that error appears in the above-identified patent and that said Letters Patent is hereby corrected as shown below:

<u>Column 10,</u>
Line 16, after "ranges," insert -- wherein said composite impedance element is a series circuit of a direct current preventing capacitor and a second inductor element having a fine inductance value; --.

Signed and Sealed this

Twenty-fourth Day of February, 2004

JON W. DUDAS
*Acting Director of the United States Patent and Trademark Office*